United States Patent
Pieh et al.

(10) Patent No.: US 8,963,127 B2
(45) Date of Patent: Feb. 24, 2015

(54) WHITE ORGANIC LIGHT EMITTING DEVICE

(75) Inventors: Sung-Hoon Pieh, Seoul (KR); Chang-Oh Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 571 days.

(21) Appl. No.: 12/910,218

(22) Filed: Oct. 22, 2010

(65) Prior Publication Data

US 2011/0121320 A1 May 26, 2011

(30) Foreign Application Priority Data

Nov. 24, 2009 (KR) ........................ 10-2009-0113752

(51) Int. Cl.
*H01L 29/08* (2006.01)
*H01L 51/50* (2006.01)

(52) U.S. Cl.
CPC ......... *H01L 51/5036* (2013.01); *H01L 51/5016* (2013.01); *H01L 51/5048* (2013.01)
USPC ............................................. 257/40; 438/99

(58) Field of Classification Search
USPC ............................................. 257/40; 313/504
See application file for complete search history.

(56) References Cited

U.S. PATENT DOCUMENTS

| | | | |
|---|---|---|---|
| 2003/0068526 A1* | 4/2003 | Kamatani et al. | 428/690 |
| 2005/0287396 A1* | 12/2005 | Nakamura et al. | 428/690 |
| 2006/0051497 A1 | 3/2006 | Hamada et al. | |
| 2006/0131562 A1 | 6/2006 | Li | |
| 2006/0232192 A1 | 10/2006 | Qiu et al. | |
| 2007/0046189 A1* | 3/2007 | Hatwar et al. | 313/506 |
| 2007/0126350 A1 | 6/2007 | Lee et al. | |
| 2008/0231174 A1 | 9/2008 | Parthasarathy et al. | |
| 2009/0200928 A1 | 8/2009 | Hwang et al. | |
| 2009/0273276 A1 | 11/2009 | Maeda | |

FOREIGN PATENT DOCUMENTS

| | | |
|---|---|---|
| CN | 1678142 A | 10/2005 |
| CN | 1713788 A | 12/2005 |
| CN | 1773745 A | 5/2006 |
| CN | 101508670 A | 8/2009 |
| EP | 1 970 977 A2 | 9/2008 |

OTHER PUBLICATIONS

Xu, Y. et al., "Efficient polymer white-light-emitting diodes with a phosphorescent dopant", Semiconductor Science and Technology, vol. 21, pp. 1373-1376.*
The First Office Action from the State Intellectual Property Office of the People's Republic of China dated Jan. 14, 2013 in Chinese counterclaim application No. 201010240655.8.

* cited by examiner

*Primary Examiner* — Ha Tran T Nguyen
*Assistant Examiner* — Aaron Dehne
(74) *Attorney, Agent, or Firm* — Morgan, Lewis & Bockius LLP

(57) ABSTRACT

A white organic light emitting device having a dual stack structure is disclosed, in which an electron transport layer adjacent to a blue light emitting layer includes an electron transport catalyst layer including metal to improve blue light emitting efficiency, and a greenish yellow dopant is used to improve white display efficiency, increase lifespan, and reduce power consumption.

9 Claims, 6 Drawing Sheets

WHITE ORGANIC LIGHT EMITTING DEVICE

This application claims the benefit of the Patent Korean Application No. 10-2009-0113752, filed on Nov. 24, 2009, which is hereby incorporated by reference as if fully set forth herein.

BACKGROUND OF THE INVENTION

1. Field of the Invention

The present invention relates to an organic light emitting device, and more particularly, to a white organic light emitting device having a dual stack structure, in which an electron transport layer adjacent to a blue light emitting layer includes an electron transport catalyst layer including metal to improve blue light emitting efficiency, and a greenish yellow dopant is used to improve white display efficiency, increase lifespan, and reduce power consumption.

2. Discussion of the Related Art

Recently, with the advent of the age of information, a display field that visually displays an electrical information signal has been rapidly developed. In this respect, various flat display devices having excellent performance such as thin profile, lightness in weight, and low power consumption have been developed to quickly substitute for an existing Cathode Ray Tube (CRT).

Examples of the flat display devices include a liquid crystal display device (LCD), a plasma display panel device (PDP), a field emission display device (FED), and an organic light emitting device (OLED).

Of the flat display devices, the organic light emitting device that does not require a separate light source is considered as a competitive application for compact size of the device and display of a clear color.

This organic light emitting device necessarily needs an organic light emitting layer. In the related art, a deposition method using a shadow mask has been used to form the organic light emitting layer.

However, in case of a shadow mask having a large area, sag may occur due to load of the shadow mask. For this reason, it is difficult to use the shadow mask several times, and a defect occurs in forming a pattern of the organic light emitting layer. In this respect, various solutions for substituting for the shadow mask have been suggested. One of the solutions is a white organic light emitting device.

Hereinafter, the white organic light emitting device will be described below.

The white organic light emitting device is characterized in that each layer between a cathode and an anode is deposited without any mask when forming a light emitting diode. In this case, organic layers including an organic light emitting layer are deposited in due order under the vacuum state by varying their components.

The white organic light emitting device has various purpose of uses such as a full color display device having a color filter, a backlight of a liquid crystal display device, or a thin light source.

The white organic light emitting device includes a plurality of light emitting layers having different colors. In this case, dopants included in each light emitting layer have different colors. However, a problem occurs in that there is a limitation in components of the dopant included in the corresponding light emitting layer due to properties of the dopant. Also, a problem occurs in that a color shift occurs due to the difference in lifespan among the dopants when the dopants continue to be used.

Moreover, as similar energy levels occur in the boundary between a light emitting layer and a hole transport layer, a problem occurs in that a triplet exciton moves to the hole transport layer over the boundary and thus light emitting efficiency of excited state is deteriorated. In order to solve this problem, an exciton blocking layer (EBL) may be provided. In this case, driving voltages and process steps are increased and lifespan is reduced. This could lead to many problems in obtaining a white organic light emitting device having proper efficiency.

The white organic light emitting device according to the related art includes light emitting layers which are deposited with either a fluorescent structure or a stack structure of blue fluorescent layer and red/green phosphor layers in view of lifespan and power consumption. In this case, the two structures have a common feature in that a blue fluorescent layer of a singlet exciton is used.

In view of the recent technical level, efficiency of the blue phosphor layer has reached a satisfactory level. However, improvement is still required in view of lifespan. For this reason, a white organic light emitting device having a blue fluorescent layer has been mainly developed but is restrictive due to efficiency problem in view of color temperature, lifespan and power consumption. In particular, in order to solve this problem, a method for improving efficiency and lifespan of a blue fluorescent layer having a restrictive internal quantum efficiency rate of 25% is required.

SUMMARY OF THE INVENTION

Accordingly, the present invention is directed to a white organic light emitting device that substantially obviates one or more problems due to limitations and disadvantages of the related art.

An object of the present invention is to provide a white organic light emitting device having a dual stack structure, in which an electron transport layer adjacent to a blue light emitting layer includes an electron transport catalyst layer including metal to improve blue light emitting efficiency, and a greenish yellow dopant is used to improve white display efficiency, increase lifespan, and reduce power consumption.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a white organic light emitting device of the present invention comprises an anode and a cathode facing each other on a substrate; a charge generation layer formed between the anode and the cathode; a first stack formed between the anode and the charge generation layer in a stack structure of a first hole transport layer, a first light emitting layer emitting blue, and a first electron transport layer; and a second stack formed between the charge generation layer and the cathode in a stack structure of a second hole transport layer, a second light emitting layer, and a second electron transport layer, the second light emitting layer doped with a phosphor greenish yellow dopant and a phosphor red dopant in one green host, and the second hole transport layer having an energy level higher than a triplet exciton energy level of the second light emitting layer.

The second hole transport layer is set to energy level higher than the triplet exciton energy level of the second light emitting layer as much as 0.01~0.4 eV.

The first hole transport layer is set to energy level higher than a triplet exciton energy level of the first light emitting layer as much as 0.01~0.4 eV.

The first electron transport layer is set to energy level higher than the triplet exciton energy level of the first light emitting layer as much as 0.01~0.4 eV, and the second electron transport layer is set to energy level higher than the triplet exciton energy level of the second light emitting layer as much as 0.01~0.4 eV.

The white organic light emitting device further comprises an electron transport catalyst layer doped with metal between the first electron transport layer and the charge generation layer.

The first electron transport layer is selected from a material that minimizes metal diffusion to the first light emitting layer, and the electron transport catalyst layer is selected from an organic matter that enables electron injection through metal doping.

The electron transport catalyst layer is a bphen based organic matter.

The metal doped in the electron transport catalyst layer includes at least any one of alkali metal, MoOx, WOx, and $V_2O_5$.

A lowest unoccupied molecular orbital (LUMO) energy level gap between the phosphor greenish yellow dopant and the phosphor red dopant of the second light emitting layer is less than 0.54 eV.

The first light emitting layer includes a blue host having a blue dopant that enables fluorescence.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

When a white organic light emitting device has a two-stack structure, each of the first stack and the second stack includes a blue light emitting layer and red and green light emitting layers. In this case, the stack structure includes two types of structures. One type is that all the light emitting layers are formed in a fluorescent structure, and the other type is that a blue light emitting layer is formed in a fluorescent structure and red and green light emitting layers are formed in a phosphor structure.

In case of the first type, a problem occurs in that light emitting efficiency is low in view of properties of fluorescent material. In case of the second type, a problem occurs in that lifespan of a phosphor material is shorter than that of the fluorescent material in view of its properties.

In particular, a green phosphor has the shortest lifespan in the same current density. In order to solve this problem, a greenish yellow dopant having the most excellent visibility curve close to 550 nm is applied to a second light emitting layer of a white organic light emitting device according to the present invention so as to improve efficiency and lifespan, whereby the white organic light emitting device having high efficiency, long lifespan, and low power consumption can be obtained as compared with the device of the related art.

Hereinafter, the white organic light emitting device according to the present invention will be described with reference to the accompanying drawings.

Figure 1:
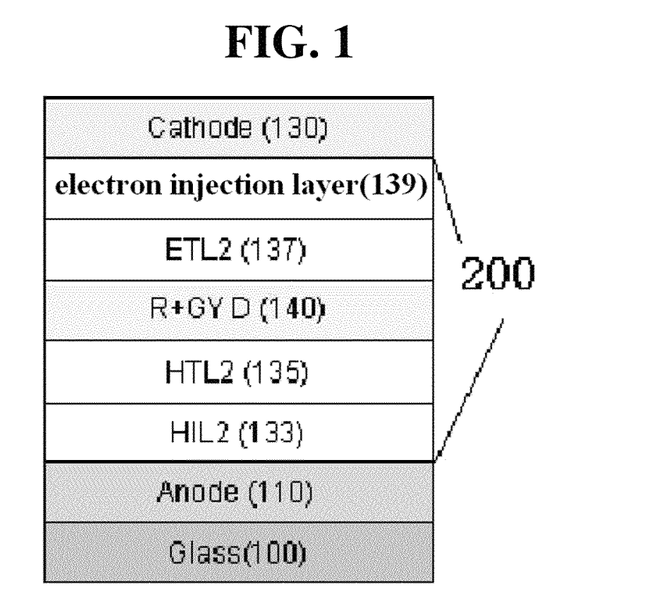
FIG. 1 is a sectional view illustrating a second stack of a white organic light emitting device according to the present invention.

FIG. 1 is a sectional view illustrating a second stack of a white organic light emitting device according to the present invention.

As shown in FIG. 1, the white organic light emitting device according to the present invention has a stack structure that a first stack (not shown in FIG. 1) is deposited near an anode 110 between the anode 110 and a cathode 130 and a second stack 200 is deposited near the cathode 130.

The first stack is omitted in FIG. 1, and the second stack is only shown in FIG. 1. Although not shown, the first stack includes a first hole transport layer, a first hole injection layer, and a first electron transport layer, wherein the first hole transport layer and the first hole injection layer are formed below a blue fluorescent light emitting layer and the first electron transport layer is formed above the blue fluorescent light emitting layer.

The second stack includes a second hole injection layer 133, a second hole transport layer 135, a second light emitting layer 140, a second electron transport layer 137, and an electron injection layer 139, which are formed from the bottom in due order. The second light emitting layer 140 includes a green host having a phosphor red and phosphor greenish yellow dopant.

In this case, a substrate 100 denotes a glass substrate where the white organic light emitting device of the present invention is formed.

The electron injection layer 139 is formed of LiF.

In this case, the cathode 130 and the anode 110 are formed at thickness of 500 Å, respectively. The respective layers constituting the second stack 200, i.e., the second hole injection layer 133, the second hole transport layer 135, the second light emitting layer 140, the second electron transport layer 137, and the electron injection layer 139 are formed, but not limited to, at thickness of 50 Å, 750 Å, 250 Å, 350 Å, and 5 Å, respectively. The other layers except for the second hole injection layer 133 and the electron injection layer 139 may have a thickness range of ±100 Å from the above thickness. The second hole injection layer 133 may be formed at a thickness range of 20~1500 Å, and the electron injection layer 130 may be formed at a thin thickness less than 20 Å.

Meanwhile, when a green dopant is used as a dopant material included in the second light emitting layer 140, when a greenish yellow dopant (GYD) is used as the dopant material included in the second light emitting layer 140, and when a red dopant (RD) is used as the dopant material included in the second light emitting layer 140, high occupied molecular orbital (HOMO) energy levels and lowest unoccupied molecular orbital (LUMO) energy levels corresponding to the respective cases are as follows.

TABLE 1

| Material | HOMO Level [eV] | LUMO Level [eV] |
|---|---|---|
| Green Dopant 1 (GD1) | 5 | 2.6 |
| Green Dopant 2 (GD2) | 5.1 | 2.5 |
| Greenish-Yellow Dopant (GYD) | 5.1 | 2.8 |
| Red Dopant 1 (RD1) | 5.1 | 3.14 |

In this case, in case of the green dopant, two types of green dopant materials, i.e., a material (GD2: second green dopant) having the same HOMO energy level as that of the green dopant and a material (GD1: first green dopant having different HOMO energy levels) are selected to measure HOMO energy level and LUMO energy level.

As shown in Table 1, in case of the first green dopant (GD1), the HOMO energy level is 5 eV and the LULMO energy level is 2.6 eV. In case of the second green dopant (GD2), the HOMO energy level is 5.1 eV and the LULMO energy level is 2.5 eV. In other words, it is noted that the second green dopant has a greater HOMO-LUMO gap, and has difficulty in reaching the excited state.

Also, in case of the greenish yellow dopant (GYD), the HOMO energy level is 5.1 eV and the LULMO energy level is 2.8 eV. In case of the red dopant (R1), the HOMO energy level is 5.1 eV and the LULMO energy level is 3.14 eV. In other words, it is noted that the HOMO-LUMO energy level gap becomes smaller towards red.

In the white organic light emitting device of the present invention, the greenish yellow dopant of the second light emitting layer included in the second stack can be selected from dopants having great values (2.6~3.14 eV) from the LUMO energy level of 3.14 eV of the red dopant to the LUMO energy level of 0.54 eV as well as the HOMO and LUMO energy levels shown in Table 1.

In this case, the reason why that the HOMO and LUMO energy levels are measured is as follows. Since the second light emitting layer of the second stack includes red of phosphor and greenish yellow dopant of phosphor, light emission occurs in such a manner that excitation is generated by the red dopant after excitation is generated by the greenish yellow dopant having lower LUMO energy level. In this case, a band gap (difference in LUMO energy level between two) between the respective dopants should be lowered to a certain value to obtain high light emission efficiency. Accordingly, in the white organic light emitting device of the present invention, the greenish yellow dopant of the second light emitting layer included in the second stack is selected from the material having a difference of 0.54 eV or less than the LUMO energy level of the red dopant.

Figure 2:
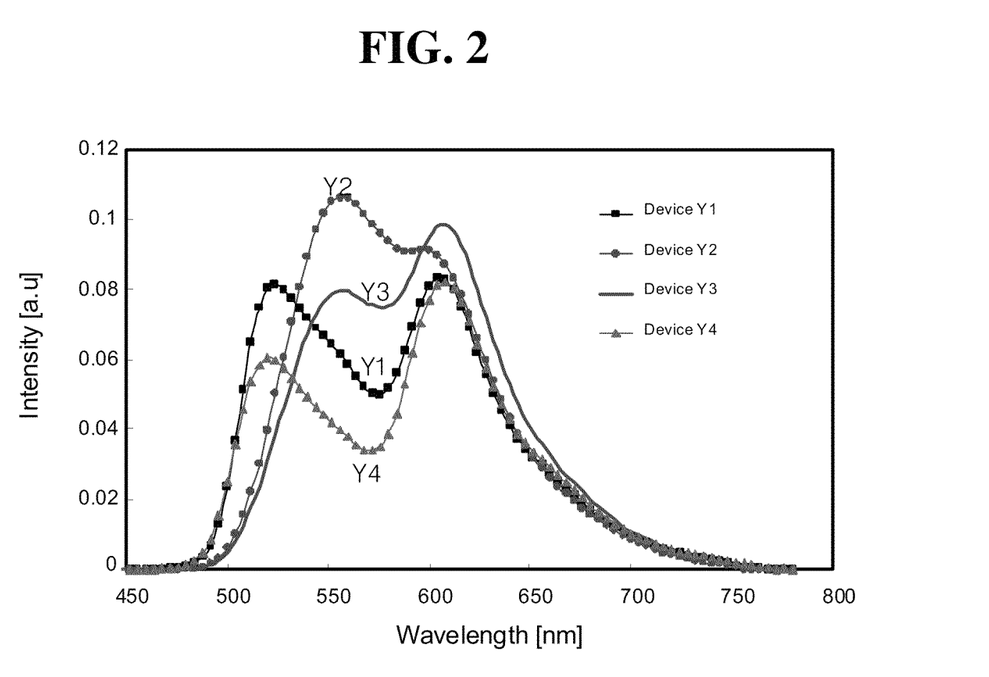
FIG. 2 is a graph illustrating intensity per wavelength when dopants included in a second light emitting layer of FIG. 2 have different component ratios.
Figure 3:
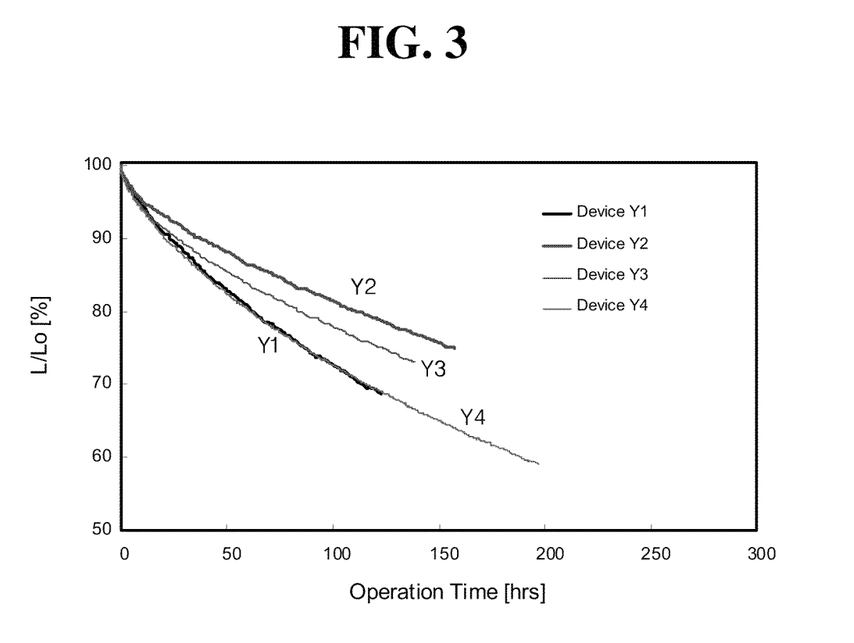
FIG. 3 is a graph illustrating each driving time of each of experimental examples of FIG. 2.

FIG. 2 is a graph illustrating intensity per wavelength when dopants included in a second light emitting layer of FIG. 2 have different component ratios, and FIG. 3 is a graph illustrating each driving time of each of experimental examples of FIG. 2.

FIG. 2, FIG. 3 and Table 2 illustrate results obtained when dopants included in the second light emitting layer have different component ratios.

Each of experimental examples Y1 to Y4 basically includes a green host (GH1 and a red dopant (RD1). The experimental examples of Y1 and Y4 include a green dopant (GD1 or GD2), and the experimental examples of Y2 and Y3 include a greenish yellow dopant (GYD).

The experimental example of Y1 includes a green dopant (GD1) of 10% and a red dopant (RD1) of 0.3%.

Also, the experimental example of Y2 includes a greenish yellow dopant (GYD) of 10% and a red dopant (RD1) of 0.2%.

Also, the experimental example of Y3 includes a greenish yellow dopant (GYD) of 10% and a red dopant (RD1) of 0.3%. The experimental example of Y3 is different from the experimental example of Y2 in the content of the red dopant (RD1).

The experimental example of Y4 includes a green dopant (GD2) of 10% and a red dopant (RD1) of 0.3%. The green dopants (GD1 and GD2) suggested in the experimental examples of Y1 and Y2 have different HOMO-LUMO energy levels from each other as described in FIG. 1 and Table 1.

TABLE 2

| Device | Host | EML Green | EML Red | @ 10 mA/cm² Volt (V) | cd/A | QE (%) | CIEx | CIEy | @ 1.000 nit cd/A |
|---|---|---|---|---|---|---|---|---|---|
| Y1 | GH1 | GD1 (10%) | RD1 (0.3%) | 3.7 | 44.0 | 18.7% | 0.450 | 0.524 | 47 cd/A |
| Y2 | | GYD (10%) | RD1 (0.2%) | 3.9 | 54.9 | 21.1% | 0.471 | 0.519 | 60 cd/A |
| Y3 | | | RD1 (0.3%) | 3.9 | 45.9 | 19.9% | 0.500 | 0.492 | 50 cd/A |
| Y4 | | GD2 (10%) | RD1 (0.3%) | 3.5 | 34.7 | 16.5% | 0.475 | 0.497 | 38 cd/A |

As noted from intensity spectrum per wavelength in FIG. 2, the light emitting layers EML that include host and dopants as shown in Y1 to Y4 have intensity (0.1 a.u) more than a certain level in a wavelength region of 490~700 nm, approximately, due to the green (or greenish yellow) and red dopants. In more detail, intensity spectrum per wavelength in Y1 to Y4 is as follows.

In other words, in case of Y1 and Y4, since the light emitting layer includes a green dopant (GD1 or GD2) and a red dopant (RD1), peak values of intensity are obtained at wavelengths of green and red. In this case, it is noted that the peak value of Y1 is greater than that of Y4. This means that excitation may occur in Y1 more easily than Y4 as the HOMO-LUMO energy level gap is relatively small in Y1 as described in FIG. 1 and Table 1.

In case of Y2 and Y3, since the greenish yellow dopant (GYD) is used, a peak value is obtained by being shifted to the right by about 50 nm from the green wavelength. Also, a peak value is obtained at the red wavelength.

In this case, Y2 is different from Y3 in the content of the red dopant (RD1). In case of Y3 having more red dopant, the peak value at the red wavelength is greater than that at the greenish yellow wavelength. By contrast, in case of Y2, the peak value at the greenish yellow wavelength is greater than that at the red wavelength.

Table 2 illustrates a driving voltage (Volt), luminance (cd/A), quantum efficiency (QE), and color coordinates (CIEx, CIEy) when current density in each light emitting layer of Y1~Y4 is 10 mA/cm$^2$, and illustrates a luminance (cd/A) value when each light emitting layer has light intensity of 1000 nit.

It is noted that quantum efficiency (QE) and luminance (cd/A) of Y2 and Y3 are higher than those of the other experimental examples. As a result, it is noted that luminance of Y2 and Y3 is higher than that of the other experimental examples.

Also, it is noted that Y2 having a lower content of the red dopant has more excellent luminance and quantum efficiency features than those of Y3.

As shown in FIG. 3, variation of a luminance (L) ratio to initial luminance (L0) is measured depending on the driving time for the experimental examples Y1~Y4. In case of L/L0 value of 80% in Y1~Y4, 62 hours are required in Y1 and Y4 while 111 hours are required in Y2. Accordingly, it is noted that the time required for luminance reduction of 20% has increased by about 79%.

In other words, it is noted that lifespan has been improved when the greenish yellow dopant is included in the second light emitting layer. As described below, it is noted that lifespan can be increased to a level similar to lifespan of the first light emitting layer.

Figure 4:
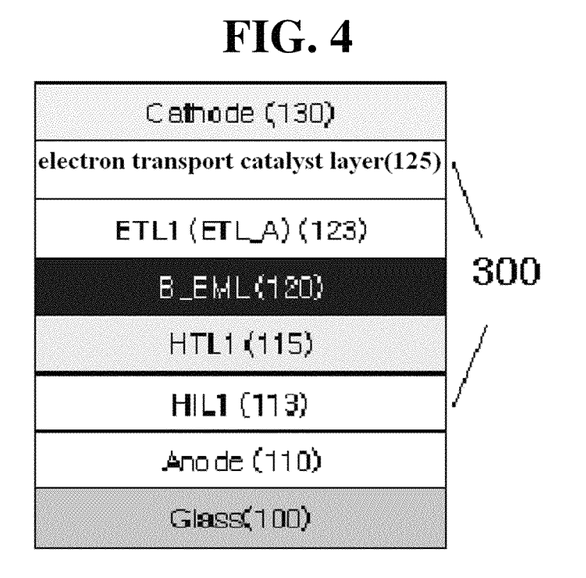
FIG. 4 is a sectional view illustrating a first stack of a white organic light emitting device according to the present invention.
Figure 5:
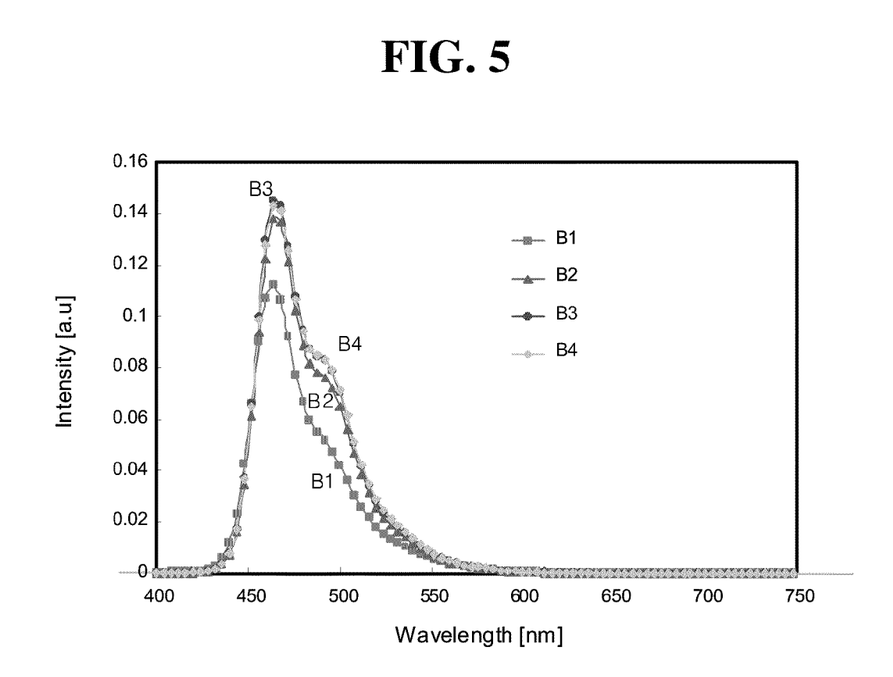
FIG. 5 is a graph illustrating intensity per wavelength when an electron transport layer adjacent to a first light emitting layer of FIG. 4 and a layer adjacent to the electron transport layer have different component ratios.
Figure 6:
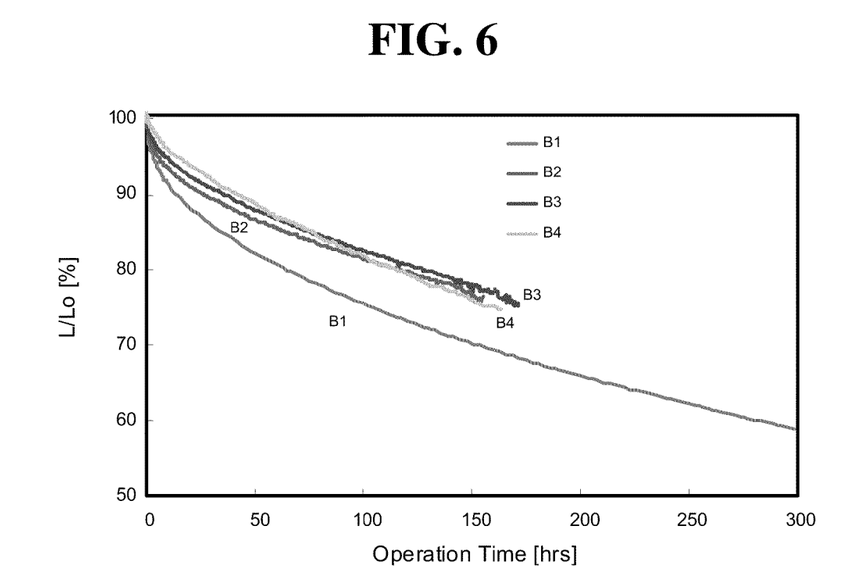
FIG. 6 is a graph illustrating each driving time of each of experimental examples of FIG. 5.

FIG. 4 is a sectional view illustrating a first stack of a white organic light emitting device according to the present invention, FIG. 5 is a graph illustrating intensity per wavelength when an electron transport layer adjacent to a first light emitting layer of FIG. 4 and a layer adjacent to the electron transport layer have different component ratios, and FIG. 6 is a graph illustrating each driving time of each of experimental examples of FIG. 5.

FIG. 4 illustrates the first stack 300 of the white organic light emitting device of the present invention. The second stack (see 200 in FIG. 1) between the cathode 130 and the first stack 300 is omitted in FIG. 4.

The first stack 300 includes a first hole injection layer 113, a first hole transport layer 115, a first light emitting layer 120, a first electron transport layer 123, and an electron transport catalyst layer 125, which are formed from the bottom in due order.

The first light emitting layer 120 includes a blue host having a blue dopant. B1~B4 in Table 3, FIG. 5 and FIG. 6 are experimental examples obtained when the electron transport layers (ETL) (first electron transport layer and electron transport catalyst layer) adjacent to the first light emitting layer 120 have different component ratios. In case of B1, a transparent electrode layer (ITO) is set at a relatively high thickness of 1400 Å. In case of the other B2~B4, the thickness of the transparent electrode layer is set to 500 Å. Also, B1 is different from B2~B4 in blue hosts (BH1, BH2) and blue dopants (BD1, BD2) included in the first light emitting layer 120. The blue hosts and the blue dopants have a difference in HOMO and LUMO energy level values. In other words, the HOMO energy level of BH1 is 5.83 eV and the LUMO energy level of BH1 is 2.79 eV. Also, the HOMO energy level of BH2 is 5.95 eV and the LUMO energy level of BH2 is 2.93 eV. Also, the HOMO energy level of BD1 is 5.60 eV and the LUMO energy level of BD1 is 2.90 eV. Also, the HOMO energy level of BD2 is 5.78 eV and the LUMO energy level of BD2 is 3.08 eV. In this case, the HOMO-LUMO band gap in B2~B4 formed by combination of BH2 and BD2 is relatively smaller than that in B1 formed by combination of BH1 and BD1. As a result, B2~B4 has more improved feature than B1 in view of quantum efficiency and luminance.

In B1 and B2, the electron transport layers are formed in a stack structure of an electron transport layer A (ETL A) and an electron transport catalyst layer (ETL B) including metal of 7%. In case of B3, the electron transport layers are formed in a stack structure of a thick electron transport layer A (ETL A) and an electron injection layer (LiF). In case of B4, the electron transport layers are formed in a triplet stack structure of an electron transport layer A (ETL A), an electron transport layer B (ETL B) and an electron injection layer (LiF) having an electron injection function. In case of B1 and B2, the electron transport layer A and the electron transport layer B doped with metal are formed at the same thickness of 150 Å.

In this case, when the electron transport layer A is only provided like B3, it is formed at thickness of 300 Å. When the electron transport layers A and B are provided like B4, they are formed at thickness of 150 Å, respectively and formed of organic material that enables electron transport.

In this case, the electron injection layer (LiF) is a material layer of LiF formed at thickness less than 20 Å.

Also, in case of B2~B4, except for thickness of the anode and the contents of the first electron transport layer and its adjacent layer, the same condition (thickness and component) is maintained for other layers except for the first electron transport layer and its adjacent layer. In this state, current density of 10.0 mA/cm2 is applied to the respective layers, whereby voltage, luminance, quantum efficiency and color coordinates have been measured as shown in Table 3.

TABLE 3

| Device | Light emitting layer | ETL | Volt (V) | Cd/A | QE (%) | CIEx | CIEy |
|---|---|---|---|---|---|---|---|
| B1 (ITO/H) | BH1 + BD1 | ETL A (150 Å)_ETL B: Li (7%, 150 Å) | 4.5 | 7.6 | 7.4 | 0.133 | 0.152 |

TABLE 3-continued

| Device | Light emitting layer | ETL | Volt (V) | Cd/A | QE (%) | CIEx | CIEy |
|---|---|---|---|---|---|---|---|
| B2 | BH2 + BD2 | ETL A (150 Å)_ETL B: Li (7%, 150 Å) | 4.7 | 10.3 | 9.2 | 0.126 | 0.175 |
| B3 | BH2 + BD2 | ETL A (300 Å)_LiF (10 Å) | 4.8 | 11.3 | 9.9 | 0.127 | 0.179 |
| B4 | BH2 + BD2 | ETL A (150 Å)_ETL B (150 Å)_LiF (10 Å) | 4.3 | 11.4 | 10.0 | 0.127 | 0.182 |

As shown in Table 3, in case of B2 that includes the electron transport layer A and the electron transport catalyst layer (ETL B) doped with metal, it is noted that luminance greater than 10.3 Cd/A and internal quantum efficiency of 9.2% or greater are maintained.

Also, even in case of B3 that having an electron transport catalyst function and an electron injection function as well as electron transport, it is noted that luminance greater than 11.3 Cd/A and internal quantum efficiency of 9.9% are maintained. Also, it is noted that B4 formed at a dual structure of electron transport layers A and B has more improved luminance and quantum efficiency than those of B3. However, B4 has problems in that process steps are increased due to a triplet stack structure and lifespan is reduced. Also, since a driving voltage of B3 is more increased relatively than that of B2, the electron transport catalyst layer is formed above the electron transport layer in the same manner as B2 by considering internal efficiency, lifespan and process, whereby desired lifespan and light emitting efficiency can be obtained.

Also, in case of B1 and B2 having electron transport layers formed in a dual stack structure, it is noted that B2 having a relatively small HOMO-LUMO band gap has more improved luminance and quantum efficiency than B1.

Intensity per wavelength of B1~B4 through the graph of FIG. 5 will be described. Since the light emitting layer includes blue hosts and blue dopants, a peak value is obtained at a wavelength of about 470 nm corresponding to blue wavelength.

Referring to size of each of B1~B4, it is noted that intensity is gradually increased towards B1, B2, B3 and B4. B3 and B4 show the spectrum having almost same intensity per wavelength. B2 shows intensity different from that of B3 and B4 at a wavelength bandwidth of 480~500 nm and is similar to B3 and B4 at the other wavelengths. In B1, spectrum including a peak value of intensity per wavelength is located below spectra of B2~B4. It is noted that intensity of B1 is remarkably lower than that of B2~B4.

As shown in FIG. 6, variation of a luminance (L) ratio to initial luminance (L0) is measured depending on the driving time for the experimental examples B1~B4. In case of L/L0 value of 80% in B1~B4, about 60 hours are required in B1 while about 111 hours are required in B2~B4. Accordingly, it is noted that the time required for luminance reduction of 20% in B2~B4 has more increased by about 85% than B1.

In other words, it is noted that blue light emitting efficiency and lifespan have been improved when the electron transport layer includes metal or further includes an electron transport catalyst layer and an electron injection layer.

Figure 7:
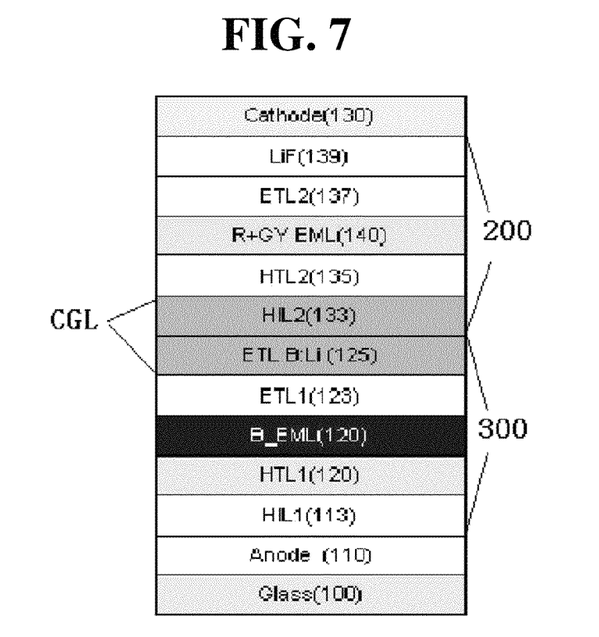
FIG. 7 is a detailed sectional view illustrating a white organic light emitting device according to the present invention.

FIG. 7 is a detailed sectional view illustrating a white organic light emitting device according to the present invention.

As shown in FIG. 7, the white organic light emitting device according to the present invention includes an anode 110, a cathode 130, a first stack 300, and a second stack 200. The anode 110 and the cathode 130 face each other on a substrate 100. The first stack 300 and the second stack 200 are formed between the anode 110 and the cathode 130.

In this case, a charge generation layer (CGL) is formed at the boundary between the first stack 300 and the second stack 200. The first electron transport catalyst layer 125 of the first stack 300, the second stack and the second hole injection layer 133 serve as the charge generation layer.

The first stack 300 will be described in detail.

The first stack 300 includes a first hole injection layer 113, a first hole transport layer 115, a first light emitting layer 120 emitting blue through fluorescence or phosphorescence, a first electron transport layer 123, and an electron transport catalyst layer 125, which are formed from the bottom in due order. In the aforementioned experiments of FIG. 4 to FIG. 6 and experiments described hereinafter, the first light emitting layer 120 is selected from a light emitting material that includes a fluorescent blue host having a blue fluorescent dopant.

The second stack 200 will be described in detail. The second stack 200 includes a second hole injection layer 133, a second hole transport layer 135, a second light emitting layer 140 including a green host doped with phosphor greenish yellow dopant and phosphor red dopant, a second electron transport layer 137, and an electron injection layer 139, which are formed from the bottom in due order.

The second hole transport layer 135 includes a second stack having an energy level higher than triplet exciton energy level of the second light emitting layer 140. Preferably, the second hole transport layer 135 is set to energy level higher than the triplet exciton energy level of the second light emitting layer 140 as much as 0.01~0.4 eV.

At this time, since the second hole transport layer 135 has energy level higher than that of the second light emitting layer 140, the triplet exciton of the second light emitting layer 140 is prevented from moving to the second hole transport layer 135, so as not to deteriorate light emitting efficiency. In other words, the second hole transport layer 135 performs a hole transport function from the second light emitting layer 140 and at the same time serves as an exciton blocking layer that prevents triplet exciton from being moved from the second light emitting layer.

Also, for the function of the exciton blocking layer, the first hole transport layer 115 can also set to energy level higher than triplet exciton energy level of the first light emitting layer 120 as much as 0.01~0.4 eV.

Likewise, it is preferable that the first electron transport layer 123 is also set to energy level higher than triplet exciton energy level of the first light emitting layer 120 as much as 0.01~0.4 eV, and the second electron transport layer 137 is also set to energy level higher than triplet exciton energy level of the second light emitting layer 140 as much as 0.01~0.4 eV.

The anode 111 is formed of a transparent electrode such as ITO (indium tin oxide). The cathode 130 is formed of a reflective metal such as Al. In this case, image is downwardly emitted based on the drawing of light emitting efficiency of the first and second stacks 300 and 200.

In this case, when the white organic light emitting device is driven, white light can be obtained by combination of light emitted by the first light emitting layer 120 and the second light emitting layer 140.

The first light emitting layer 120 emits fluorescence while the second light emitting layer 140 emits phosphorescence.

In case of the second light emitting layer 140 of phosphorescence, energy transfer is performed in the order of green host, greenish yellow dopant and red dopant. Phosphorescence is generated in such a manner that triplets within the second light emitting layer 140 are excited.

Fluorescence is generated in such a manner that singlet of about 25% of internal carriers is excited in the first light emitting layer 120. And, light emitting efficiency can be improved by delayed fluorescence that emits energy by generating singlet exciton through triplet-triplet annihilation (TTA) of triplets of the other 75%, which are not reacted.

The electron transport catalyst layer 125 includes metal such as Li at a small content (7%) at thickness similar to that of the first electron transport layer 123, thereby facilitating electron injection. The first electron transport layer 123 below the electron transport catalyst layer 125 enhances electron transport efficiency to the first light emitting layer 120 and prevents metal from being diffused to the first light emitting layer 120.

At this time, the first electron transport layer 123 is selected from a material that minimizes metal diffusion to the first light emitting layer 120. Also, it is preferable that the electron transport catalyst layer 125 is selected from an organic matter that enables electron injection through metal doping. For example, bphen based organic matter may be used as the organic matter.

Meanwhile, metal doped in the first electron transport catalyst layer 125 can include at least any one of alkali metal, such as Li, MoOx, WOx, and $V_2O_5$.

As described in FIG. 1 and FIG. 2, the LUMO energy level gap between phosphor greenish yellow dopant and phosphor red dopant of the second light emitting layer 140 is preferably less than 0.54 eV.

Meanwhile, when the example of FIG. 7 is W3, W1 and W3 having red and green phosphor light emitting layers of the second light emitting layer will be compared with W3. In this case, W1 is different from W2 in that the first stack does not include a first electron transport catalyst layer of organic matter adjacent to the first electron transport layer but includes Li metal layer, the energy level condition of the second hole transport layer adjacent to the second light emitting layer of the second stack is not different from the aforementioned condition, and an exciton blocking layer (EBL) is provided. W2 is different from W3 in that the second light emitting layer includes red and green phosphor dopants.

As shown in Table 4, when 1000 nit is maintained, it is noted that W3 which is the white organic light emitting device of the present invention has a driving voltage of 6.5V but has stable luminance of 59.1 Cd/A. W2 has a relatively high driving voltage of 6.9V and low luminance. W1 has problems in that the exciton blocking layer should additionally be provided and luminance is relatively low.

TABLE 4

| Device | 1st stack | 2nd stack | Volt (V) | Cd/A | CIEx | CIEy |
|---|---|---|---|---|---|---|
| W1 | B0 | Y1 | 5.9 | 56.5 | 0.368 | 0.385 |
| W2 | B1 | Y1 | 6.9 | 54.5 | 0.322 | 0.345 |
| W3 | B2 | Y2 | 6.5 | 59.1 | 0.363 | 0.325 |

Figure 8:
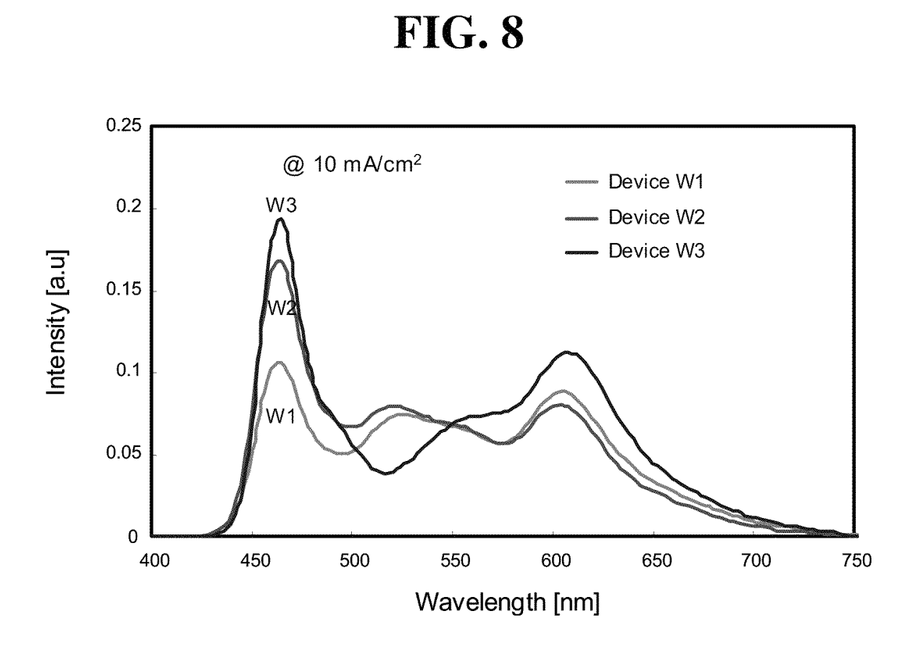
FIG. 8 is a graph illustrating intensity per wavelength of a white organic light emitting device according to the present invention and experimental examples compared with the white organic light emitting device.

FIG. 8 is a graph illustrating intensity per wavelength of a white organic light emitting device according to the present invention and experimental examples compared with the white organic light emitting device.

As shown in FIG. 8, in case of intensity per wavelength of experimental examples W1~W3, it is noted that a peak value is increased in W3. It is noted that W3 has a peak value in greenish yellow not green as compared with W1 and W2 having R and B dopants.

Figure 9:
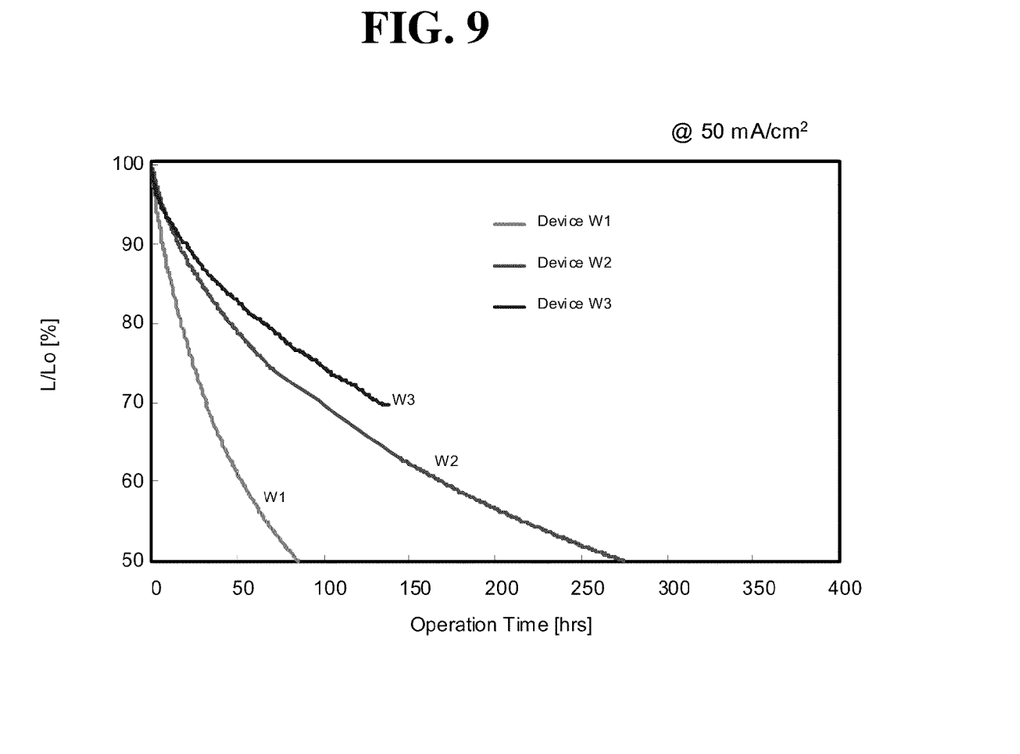
FIG. 9 is a graph illustrating luminance data according to driving time in a white organic light emitting device according to the present invention and experimental examples compared with the white organic light emitting device.

FIG. 9 is a graph illustrating luminance data according to driving time in a white organic light emitting device according to the present invention and experimental examples compared with the white organic light emitting device.

As shown in FIG. 9, when current density is 50 mA/cm$^2$, luminance reduction per driving time is remarkably noted. When variation of a luminance (L) ratio to initial luminance (L0) is measured depending on the driving time, in case of L/L0 value of 80% in W1-W4, it is noted that 75 hours are required in W3, 51.7 hours are required in W2, and about 20 hours are required in W1. It is noted that the driving time of about 47% or greater has been improved in case of W3 as compared with W2 having the second light emitting layer with different components.

Meanwhile, the aforementioned values are obtained by giving the accelerating condition for the variation of a luminance ratio to initial luminance. Unlike this, when the luminance condition of the white organic light emitting device is 1000 nit, it is noted that W1 has lifespan of 17000 hours, W2 has lifespan of 55000 hours, and W3 has lifespan of 81000 hours.

Figure 10:
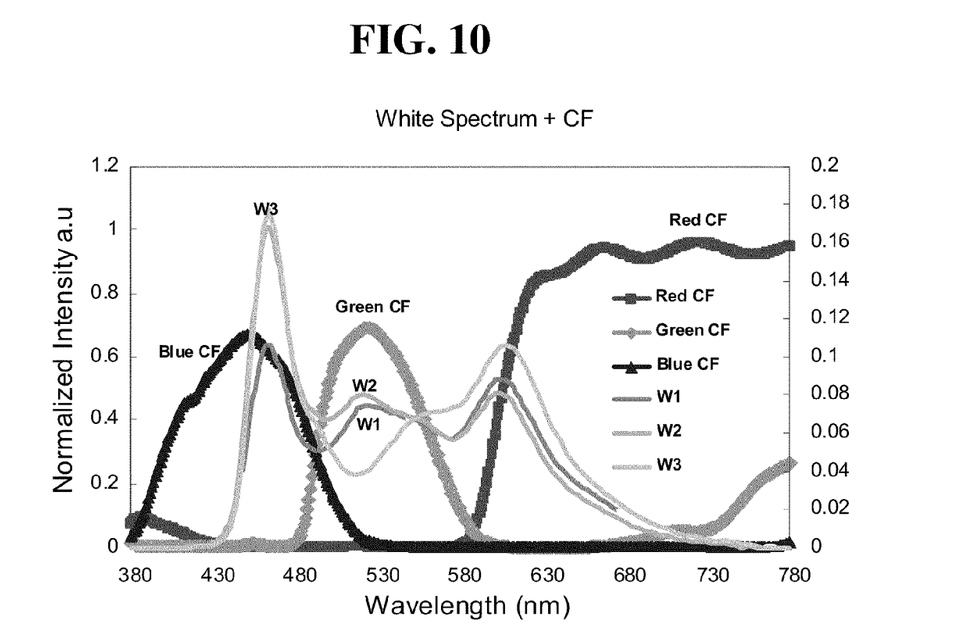
FIG. 10 is a graph illustrating spectra of R, G, B color filters, a white organic light emitting device according to the present invention and experimental examples compared with the white organic light emitting device.

FIG. 10 is a graph illustrating spectra of R, G, B color filters, a white organic light emitting device according to the present invention and experimental examples compared with the white organic light emitting device.

In FIG. 10, each spectrum of color filter R, G, B films is overlapped with each spectrum of W1 to W3. In case of W3 which is the white organic light emitting device of the present invention, it is noted that a high peak value is obtained in blue, greenish yellow, and red. It is also noted that W3 has higher intensity at red wavelength than that of W1 and W2. Since phosphorescence efficiency of the yellow greenish dopant in the second light emitting layer is relatively higher than that of the green dopant and the difference between exciton energy level of the yellow greenish dopant and energy level of the green dopant is small, light emitting efficiency is increased at both wavelengths.

TABLE 5

|  |  | Phosphor-fluorescence Hybrid | | |
|---|---|---|---|---|
| Remarks |  | W1 | W2 | W3 |
| White efficiency color coordinates |  | 56.5 Cd/A (0.37, 0.38) | 54.5 Cd/A (0.32, 0.345) | 59 Cd/A (0.36, 0.32) |
| NTSC | U'v' | 103% | 106% | 106% |
| CF transmittance | R | 14.1% | 12.3% | 16.6% |
|  | G | 31.5% | 32.5% | 25.2% |
|  | B | 3.4% | 4.8% | 4.3% |

TABLE 5-continued

| | Phosphor-fluorescence Hybrid | | |
|---|---|---|---|
| Remarks | W1 | W2 | W3 |
| Standard moving picture reference consumed power (500 nit, 9000K) Circuit 14 W | 8 W | 67 W | 65.7 W |
| Lifespan 1000 nit (hrs) | 30000 | 60000 | 81,000 |

Table 5 illustrates white efficiency color coordinates of W1, W2 and W3, efficiency at NTSC coordinate system, CF transmittance, consumed power based on standard moving picture reference condition (500 nit, 9000K), and lifespan based on luminance condition of 1000 nit.

As noted in Table 5, it is noted that white efficiency color coordinates, efficiency at NTSC coordinate system, red and blue CF transmittance, consumed power based on standard moving picture reference condition, and lifespan have been improved when the device of W3 is implemented, except that green CF transmittance is relatively low.

In this case, the green CF transmittance is low as the second light emitting layer does not include green dopant but includes a greenish yellow dopant. If a material shifted to yellow is used as the green color filter, high color reproduction rate can be obtained in the corresponding color filter as the case may be.

Meanwhile, since the white organic light emitting device is important in view of color purity, color stability, optical properties such as color stability according to current and voltage, light emitting efficiency, lifespan, and easiness of fabrication, its various modes have been developed. Recently, a device that enhances internal quantum efficiency using both singlet excited state and triplet excited state by combining phosphorescence and fluorescence is being developed.

Also, a white organic light emitting device of high efficiency, which can obtain internal quantum efficiency of 100% by applying red, green and blue to phosphorescence, has been developed.

However, a white organic light emitting device of two-stack using blue fluorescence and red and green phosphorescence has been mainly developed until now due to a blue phosphor material that requires improvement in view of lifespan.

Also, the light emitting device has limitation in application to a large scaled display as power consumption increases due to the lifespan problem caused by limited efficiency of blue fluorescence.

The organic light emitting device of the present invention has the following advantages.

First of all, according to the organic light emitting device of the present invention, when the white organic light emitting device of a two-stack structure is formed, the first stack includes a light emitting layer for blue light emission and the second stack includes red and green light emitting layers of phosphor. In case of the light emitting layers included in the second stack, a green host includes a red dopant and a greenish yellow dopant to improve white display efficiency, whereby a current value required for driving of a panel can be reduced. This could lead to improvement of lifespan. At this time, a greenish yellow dopant having the most excellent visibility curve close to 550 nm is applied to the second stack so as to improve efficiency and lifespan, thereby obtaining a white organic light emitting device having high efficiency, long lifespan, and low power consumption as compared with the device of the related art.

Second, even though separate colors of red, green and blue are displayed through a color filter, a green color filter is provided to correspond to greenish yellow, whereby color quality can be prevented from being deteriorated.

Third, a hole layer having high triplet energy and a dual electron transport layer doped with metal are provided to enable triplet-triplet annihilation, improve efficiency of blue fluorescence and increase lifespan, whereby good color quality and low power consumption can be achieved.

Fourth, when a white organic light emitting device is formed in a dual stack structure having a blue light emitting layer and green and red light emitting layers in each stack between an anode and a cathode, an energy level of a hole transport layer is set to be higher than an energy level of excited state by 0.01~0.4 eV in the light emitting layer of greenish yellow and red, whereby exciton of the excited state is prevented from flowing to the hole transport layer. Accordingly, the hole transport layer serves as an exciton (singlet, triplet) blocking layer together with a hole transport function, whereby a separate exciton blocking layer is not provided. As a result, process steps are not increased and power consumption can be reduced. Moreover, components of singlet exciton and triplet exciton remaining in the light emitting layer are continuously used for light emission, whereby light emitting efficiency can be improved.

Fifth, since a material having increased lifespan is used as the greenish yellow dopant, lifespan of the device can be increased.

Finally, one stack of a white organic light emitting device includes a blue fluorescent light emitting layer including a blue dopant and the other stack includes a phosphor light emitting layer including a host material having greenish yellow and red dopants at an appropriate amount. In this case, a uniform peak value and a distinct peak occur in each wavelength, whereby a color reproduction rate can be increased in case of application of a color filter.

Therefore, the light emitting layer having greenish yellow phosphor dopant and red phosphor dopant having excellent color quality is formed. Light emitting efficiency and lifespan are improved using the blue fluorescent dopant in the first stack. Also, since the electron transport layer includes a hole layer having triplet energy higher than the light emitting layer and an electron transport catalyst layer doped with metal, white light emitting efficiency can be improved using triplet-triplet annihilation and at the same time color quality and low power consumption can be obtained.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A white organic light emitting device comprising:
an anode and a cathode facing each other on a substrate;
a charge generation layer formed between the anode and the cathode;
a first stack formed between the anode and the charge generation layer in a stack structure of a first hole transport layer, a first light emitting layer emitting blue, and a first electron transport layer;
a second stack formed between the charge generation layer and the cathode in a stack structure of a second hole transport layer, a second light emitting layer, and a second electron transport layer, the second light emitting layer doped with a phosphor greenish yellow dopant having a single maximum peak wavelength in about 550 nm and a phosphor red dopant having a single maximum peak wavelength in about 610 nm in one host, and the second hole transport layer having an energy level higher than a triplet exciton energy level of the second light emitting layer; and an electron transport catalyst layer doped with metal oxide between the first electron transport layer and the charge generation layer, wherein the first electron transport layer is selected from a material that minimizes metal diffusion to the first light emitting layer, and the electron transport catalyst layer is selected from an organic material that enables electron injection through metal doping or metal oxide doping.

2. The white organic light emitting device of claim 1, wherein the second hole transport layer is set to energy level higher than the triplet exciton energy level of the second light emitting layer as much as 0.01~0.4 eV.

3. The white organic light emitting device of claim 2, wherein the first hole transport layer is set to energy level higher than a triplet exciton energy level of the first light emitting layer as much as 0.01~0.4 eV.

4. The white organic light emitting device of claim 3, wherein the first electron transport layer is set to energy level higher than the triplet exciton energy level of the first light emitting layer as much as 0.01~0.4 eV, and the second electron transport layer is set to energy level higher than the triplet exciton energy level of the second light emitting layer as much as 0.01~0.4 eV.

5. The white organic light emitting device of claim 1, wherein the electron transport catalyst layer is a bphen based organic material.

6. The white organic light emitting device of claim 1, wherein the metal oxide doped in the electron transport catalyst layer includes at least any one of alkali metal, MoOx, WOx, and $V_2O_5$.

7. The white organic light emitting device of claim 1, wherein a lowest unoccupied molecular orbital (LUMO) energy level gap between the phosphor greenish yellow dopant and the phosphor red dopant of the second light emitting layer is less than 0.54 eV.

8. The white organic light emitting device of claim 1, wherein the first light emitting layer includes a blue host having a blue dopant that enables fluorescence.

9. A white organic light emitting device comprising:
an anode and a cathode facing each other on a substrate;
a charge generation layer formed between the anode and the cathode;
a first stack formed between the anode and the charge generation layer in a stack structure of a first hole transport layer, a first light emitting layer emitting blue, and a first electron transport layer;
a second stack formed between the charge generation layer and the cathode in a stack structure of a second hole transport layer, a second light emitting layer, and a second electron transport layer, the second light emitting layer doped with first and second phosphor dopants in one host, the first and second phosphor dopants providing an emission spectrum with only two single peaks at, respectively, a wavelength of about 550 nm and a wavelength of about 610, and the second hole transport layer having an energy level higher than a triplet exciton energy level of the second light emitting layer; and
an electron transport catalyst layer doped with metal oxide between the first electron transport layer and the charge generation layer,
wherein the first electron transport layer is selected from a material that minimizes metal diffusion to the first light emitting layer, and the electron transport catalyst layer is selected from an organic material that enables electron injection through metal doping or metal oxide doping.

* * * * *